(12) United States Patent
Kim et al.

(10) Patent No.: US 6,183,589 B1
(45) Date of Patent: Feb. 6, 2001

(54) METHOD FOR MANUFACTURING LEAD-ON-CHIP (LOC) SEMICONDUCTOR PACKAGES USING LIQUID ADHESIVE APPLIED UNDER THE LEADS

(75) Inventors: Shin Kim; Byung Man Kim; Il Heung Choi; Jeong Ho Bang, all of Cheonan (KR)

(73) Assignee: Samsung Electronics Co., Ltd., Suwon (KR)

( * ) Notice: Under 35 U.S.C. 154(b), the term of this patent shall be extended for 0 days.

(21) Appl. No.: 09/035,965

(22) Filed: Mar. 6, 1998

(30) Foreign Application Priority Data

Mar. 14, 1997 (KR) ............................................. 97-8646

(51) Int. Cl.[7] ...................................................... B32B 31/00
(52) U.S. Cl. ............................ 156/249; 156/538; 29/827; 29/740; 438/118
(58) Field of Search ........................... 156/107, 109, 156/247, 249, 538, 539, 556; 29/827, 740, 741; 438/118

(56) References Cited

U.S. PATENT DOCUMENTS

| 5,696,033 | * | 12/1997 | Kinsman | 438/118 |
| 5,776,799 | * | 7/1998 | Song et al. | 438/118 |
| 5,861,678 | * | 1/1999 | Schrock | 257/783 |
| 5,897,339 | * | 4/1999 | Song et al. | 438/118 |
| 5,943,557 | * | 8/1999 | Moden | 438/118 |
| 6,013,535 | * | 1/2000 | Moden et al. | 438/118 X |

FOREIGN PATENT DOCUMENTS

| 7-66225 | 3/1995 | (JP) . |
| 7-202114 | 8/1995 | (JP) . |

* cited by examiner

*Primary Examiner*—Francis J. Lorin
(74) *Attorney, Agent, or Firm*—Jones Volentine, L.L.C.

(57) ABSTRACT

A method for manufacturing lead-on-chip (LOC) semiconductor packages includes steps of preparing a lead frame having inner leads and outer leads, and applying a liquid adhesive having a certain viscosity to the bottom surfaces of the inner leads. The method also includes positioning a semiconductor chip under the lead frame, to expose electrode pads through the space defined between opposing rows of inner leads. The inner leads are then attached to the active surface of the semiconductor chip by means of the liquid adhesive. The adhesive applying step may be carried out using a tool having discharge projections through which liquid adhesive is discharged from a reservoir. The liquid adhesive under the lead frame may be cured and then turned into a solid adhesive layer by thermocompression. The liquid adhesive is a thermosetting resin or a thermoplastic resin.

18 Claims, 11 Drawing Sheets

METHOD FOR MANUFACTURING LEAD-ON-CHIP (LOC) SEMICONDUCTOR PACKAGES USING LIQUID ADHESIVE APPLIED UNDER THE LEADS

BACKGROUND OF THE INVENTION

1. Field of the Invention

The present invention relates generally to methods for manufacturing semiconductor packages. More particularly, the present invention relates to methods for manufacturing lead-on-chip (LOC) semiconductor packages in which leads of a lead frame are attached to a chip by an adhesive layer which is formed from a liquid adhesive applied to a bottom surface of the leads.

2. Description of the Related Art

As the integration density of a semiconductor integrated circuit (IC) device increases, so does the size of the semiconductor chip. However, to meet a demand for smaller and smaller devices, there are continuing efforts to reduce the size of the semiconductor chip packages. Various packaging technologies have been developed to meet this need for package miniaturization. One of them is the lead-on-chip (LOC) package technology in which a plurality of leads are disposed on and attached to the active surface of a semiconductor chip.

A lead frame of a typical semiconductor chip package includes a chip pad or a die pad on which the chip is mounted, and a plurality of leads which extend from the chip pad. On the other hand, the LOC package does not require a chip pad since the chip is directly attached to the leads. Accordingly, the ratio of the size of the chip to the size of the package is quite high. Other advantages of the LOC package are lead frame design flexibility and enhanced electrical performance.

A conventional LOC semiconductor package 100 is depicted in FIG. 1A in cross section showing a semiconductor chip 10, a lead frame 20, and an adhesive tape 30. FIG. 2A shows the spatial distribution of the lead frame 20, the chip 10, and the adhesive tape 30 in exploded perspective. FIG. 1B and FIG. 2B show enlarged views of portion 'C' in FIG. 1A and 'D' in FIG. 2A, respectively. As shown, a plurality of inner leads 22 of the lead frame 20 are attached to an active surface 12 of the chip 10. Physical adhesion between the lead frame 20 and the chip 10 is accomplished by adhesive tapes 30, while electrical interconnection between both is accomplished by bonding wires 40 connecting inner leads 22 to electrode pads 14.

A plurality of electrode pads 14 are formed along the center of the active surface 12 of the chip 10. The inner leads 22 are spaced apart so that the central electrode pads 14 are exposed between the opposing rows of the inner leads 22 on each side of the lead frame 20. Each inner lead 22 is electrically connected to a corresponding electrode pad 14. Each of the inner leads 22 is brought in close proximity to the respective corresponding electrode pad 14, and thus the lead frame 20 can be connected electrically to the chip 10 by means of short bonding wires 40.

Outer leads 24 extend outwardly from a package body 50, and are mounted to an exterior circuit board (not shown) after completing the entire packaging process. The package body 50 is formed from an encapsulant such as epoxy molding compound (EMC) in order to protect the chip 10, the inner leads 22, and the bonding wires 40 from hostile external environments. Dam bars 26, which are located across the inner leads 22 and the outer leads 24, not only impart some rigidity to the lead frame 20, but also prevent overflow of encapsulant during the encapsulation process. Therefore, the dam bars 26 fix the boundaries of the area where the package body 50 is formed. The dam bars 26 are removed after the encapsulation process, and so do not exist in the package 100 shown in FIG. 1. Tie bars 28 inside the package body 50 support the package 100 after the encapsulation process is completed.

The adhesive tape 30 typically comprises three layers. There is an adhesive layer 34, such as thermoplastic epoxy, on both sides of a center layer formed of a polyimide base film 32.

The assembly process of the conventional LOC package 100 is described next. First, solid adhesive tape 30 is applied to the bottom of a lead frame. Then, a chip 10 is positioned under the lead frame 20. The lead frame 20 with adhesive tape 30 may be baked so as to eliminate moisture from interfaces between the lead frame 20 and the adhesive tape 30, or between the layers 32, 34 in the adhesive tape 30. Then, the adhesive tape 30 on the frame is brought into contact with the active surface 12 of the chip 10 under high temperature to attach the lead frame 20 to the chip 10. After this, various conventional steps are conducted in succession to complete the packaging process. The steps may include electrical interconnection using the bonding wires 40, encapsulation for forming the package body 50, removal of the dam bars 26, and reshaping of the outer leads 24.

Though an advancement over other packages types in many respects, the conventional LOC packages employing the solid adhesive tape have some disadvantages. One problem is the structure of the adhesive tape itself. Since the adhesive tape consists of three layers, four interfaces exist between the chip and the lead frame. The interfaces between these two heterogeneous materials can produce thermal and mechanical stresses that can result in delaminations (i.e., separations at the interfaces), and in accompanying cracks of the package body. Furthermore, such package cracking may be accelerated by moisture absorption at the interfaces of the adhesive tape.

Another problem is associated with the production process for the adhesive tape itself. The solid three-layer adhesive tape is made by a several step process. The adhesive materials must be coated on one side of the base film and cured, and then also coated on the other side of the base film and cured again. Accordingly, the tape production process is complicated. In addition, the finished adhesive tape is difficult to handle since it has adhesive layers on both sides. Furthermore, the adhesive tape contains an expensive polyimide base film, which consequently results in a high production cost for the tape.

SUMMARY OF THE INVENTION

It is therefore an object of the present invention to provide methods for manufacturing lead-on-chip semiconductor packages with improved reliability due to the reduction of the number of interfaces associated with adhesive tape.

It is another object of the present invention to provide methods for manufacturing lead-on-chip semiconductor packages through a simpler process of forming a single adhesive layer directly on the lead frame.

It is still another object of the present invention to provide methods for manufacturing lead-on-chip semiconductor packages at a lower cost.

These and other objects of the present invention are attained by a method for manufacturing lead-on-chip semiconductor packages that includes preparing a lead frame having a plurality of inner leads and outer leads, and applying a liquid adhesive having a certain viscosity to the bottom surfaces of the inner leads. The method further includes positioning a semiconductor chip under the lead frame, the semiconductor chip having an active surface on which a plurality of electrode pads are formed. The plurality of electrode pads are exposed through a space defined between opposing rows of the plurality of inner leads. The method then involves attaching the plurality of inner leads to the active surface of the semiconductor chip by means of the liquid adhesive.

In a particular embodiment of the method, the step of applying the liquid adhesive to the inner leads is carried out using an adhesive applying tool having a reservoir containing the liquid adhesive and discharge projections. In other embodiments, the step of attaching includes forming an adhesive layer by curing the liquid adhesive; for example, by moving a bonding head downwardly from above the lead frame, and simultaneously moving a bonding stage upwardly from below the lead frame, and thermocompressing the semiconductor chip and the lead frame between the bonding head and the bonding stage.

Another aspect of the present invention is the tool itself for applying the liquid adhesive. The tool is made up of a reservoir containing a liquid adhesive of a certain viscosity, a discharge projection disposed below a lead frame in flow communication with the reservoir, and a means for applying pressure to the liquid adhesive in the reservoir sufficient to cause the liquid adhesive to discharge through the discharge projection. One embodiment of the tool includes a roller disposed below the discharge projection to cause the liquid adhesive to discharge uniformly.

BRIEF DESCRIPTION OF THE DRAWINGS

The accompanying drawings illustrate embodiments of the present invention, in which.

DETAILED DESCRIPTION OF THE INVENTION

Figure 1A:
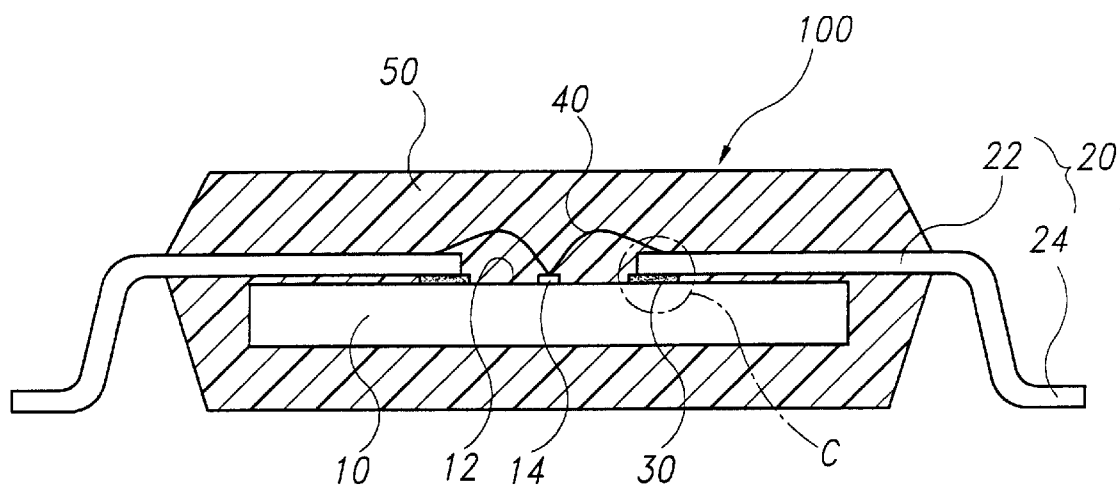
FIG. 1A is a cross-sectional view of a conventional lead-on-chip (LOC) semiconductor package.

Various features and advantages of the present invention will become better understood and more completely described with reference to the accompanying drawings in which embodiments of the invention are illustrated. The present invention, however, may be embodied in many different forms and should not be construed as limited to the specific embodiments set forth herein. These embodiments are provided so that this disclosure will be thorough and complete, and will fully convey details of the invention to those skilled in the art. In the drawings, like numbers refer to like elements throughout.

Figure 1B:
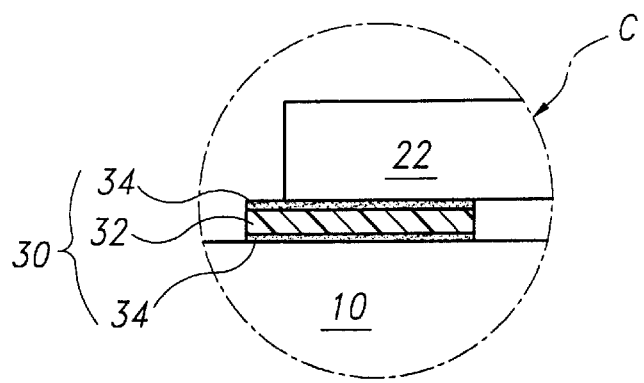
FIG. 1B is an enlarged view of portion 'C' from FIG. 1A.
Figure 2A:
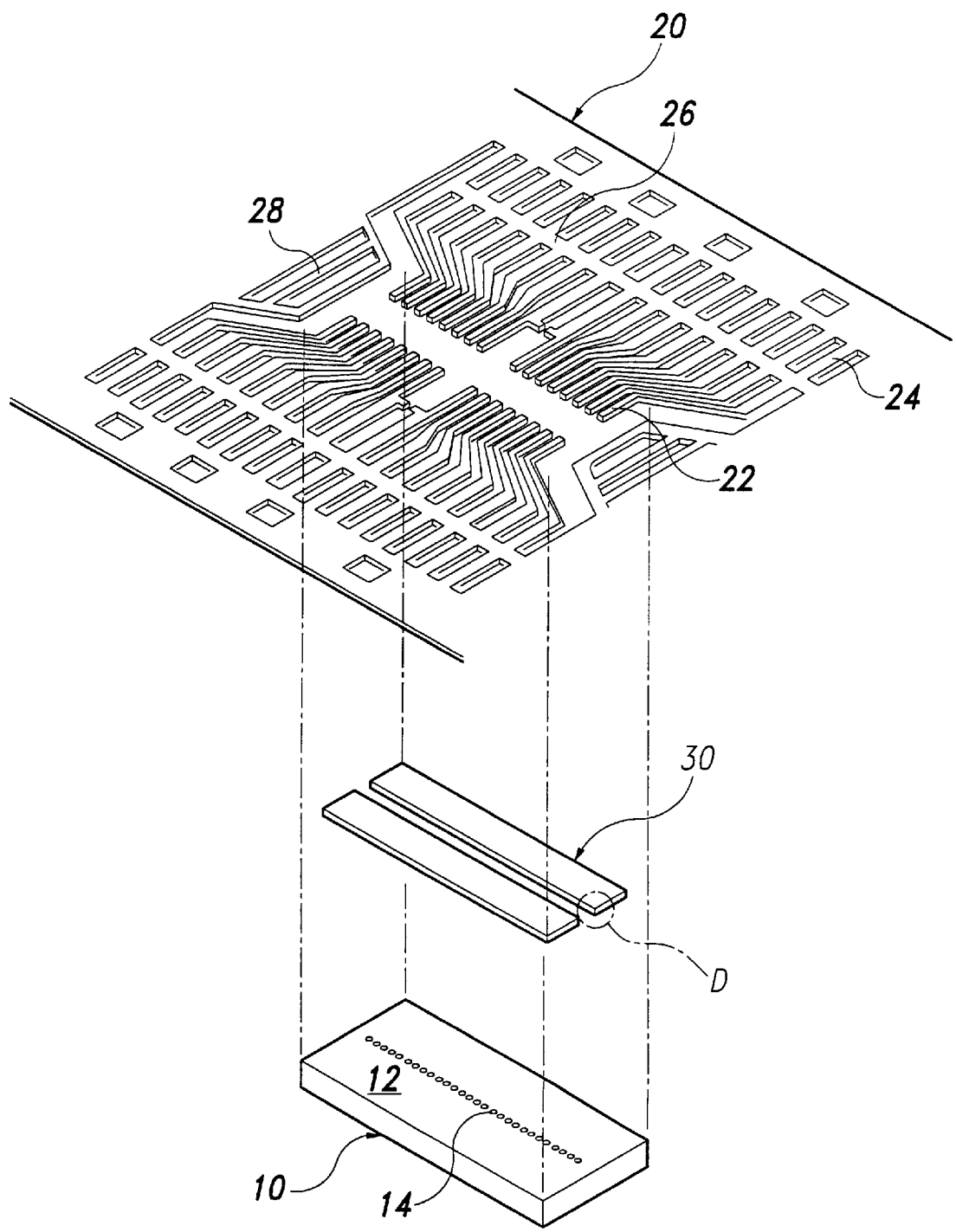
FIG. 2A is an exploded perspective view illustrating the spatial relation between a semiconductor chip, a lead frame, and an adhesive tape of the package shown in FIG. 1.
Figure 2B:
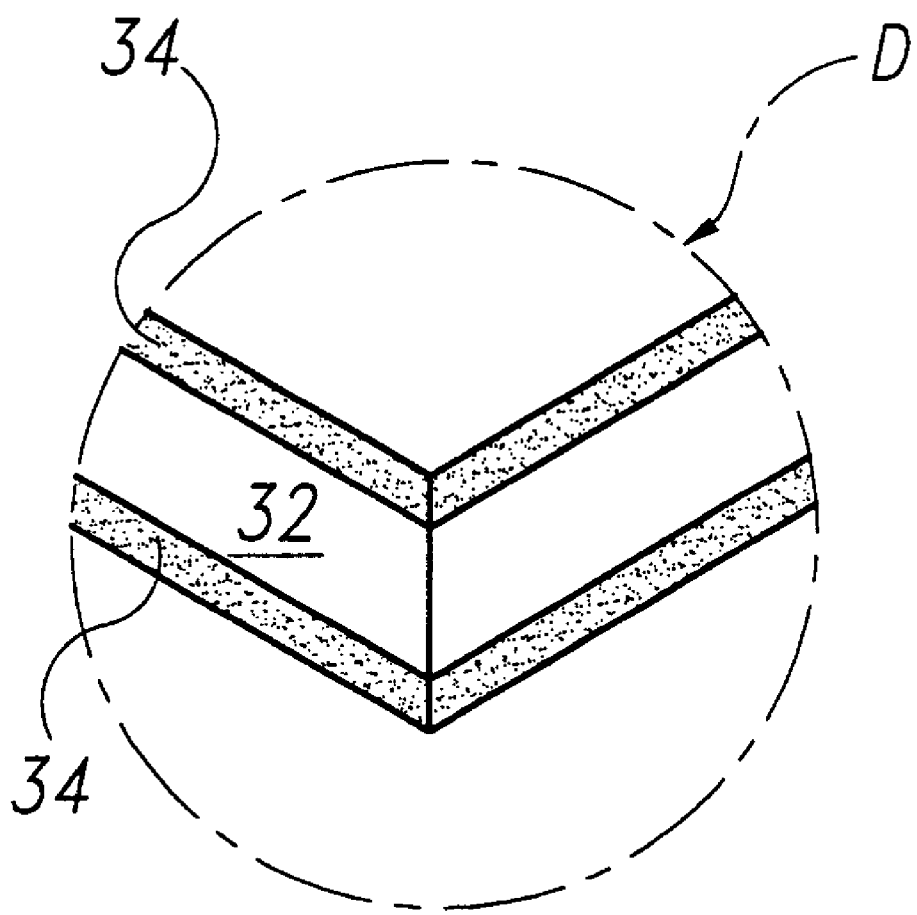
FIG. 2B is an enlarged view of portion 'D' from FIG. 2A.
Figure 3A:
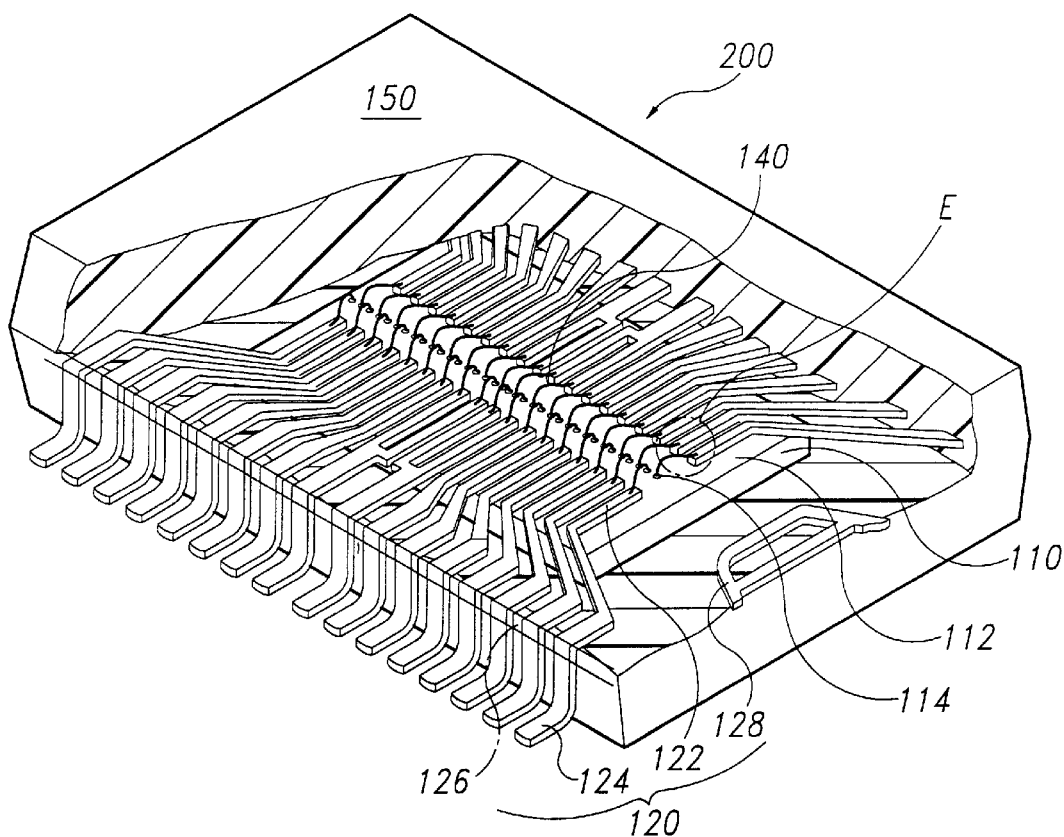
FIG. 3A is a partially cut away perspective view of a LOC semiconductor package produced by methods in accordance with the present invention.
Figure 3B:
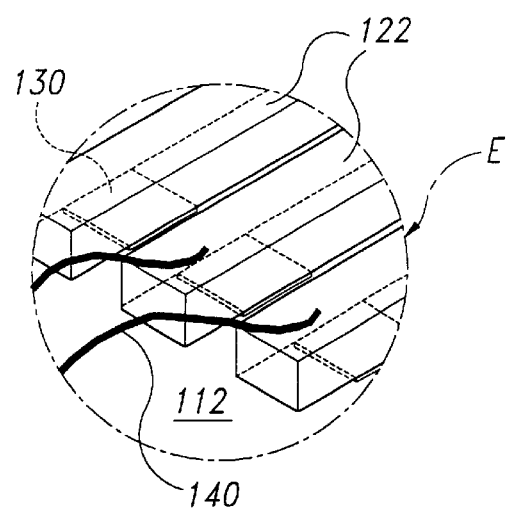
FIG. 3B is an enlarged view of portion 'E' in FIG. 3A.

FIG. 3A is a partially cut away perspective view of a lead-on-chip (LOC) semiconductor package 200 produced by methods in accordance with the present invention, and FIG. 3B is an enlarged view of portion 'E' in FIG. 3A. Referring to FIGS. 3A and 3B, the LOC package 200 has a structure where a plurality of inner leads 122 of a lead frame 120 are disposed on and attached to an active surface 112 of a semiconductor chip 110. This attachment between the semiconductor chip 110 and the lead frame 120 is accomplished by a single adhesive layer 130 instead of the conventional three-layer adhesive tape (depicted in FIG. 1 and FIG. 2). As will be described later, the single adhesive layer 130 is formed from a liquid adhesive (132 in FIG. 4).

The chip 110 has a plurality of electrode pads 114 which are formed on the active surface 112 of the chip 110. The electrode pads 114 are preferably, but not necessarily, formed at a central part of the active surface 112. Each of the electrode pads 114 is electrically coupled to a respective, corresponding one of the inner leads 122 by means of a bonding wire 140. The chip 110, the adhesive layer 130, the inner leads 122, and the bonding wires 140, are encapsulated with an encapsulant, such as epoxy molding compound (EMC), to form a package body 150. The package body 150 provides protection from hostile external environments. Outer leads 124 and tie bars 128 are not described further since these have the same structure and function as conventional ones. In addition, dam bars 126, which are the same as conventional ones, have already been cut away, and their positions before being cut are shown by hidden lines in FIG. 3A.

In accordance with the present invention, the adhesive layer 130 is formed from a liquid adhesive which is applied to a bottom surface of the inner leads 122. Accordingly, the resulting adhesive layer 130 is formed as a single layer, contrary to the conventional three-layer adhesive tape. Consequently, the number of interfaces between the chip 110 and the lead frame 120 decreases from four in the conventional LOC package to two interfaces in the LOC package of the present invention.

Figure 4:
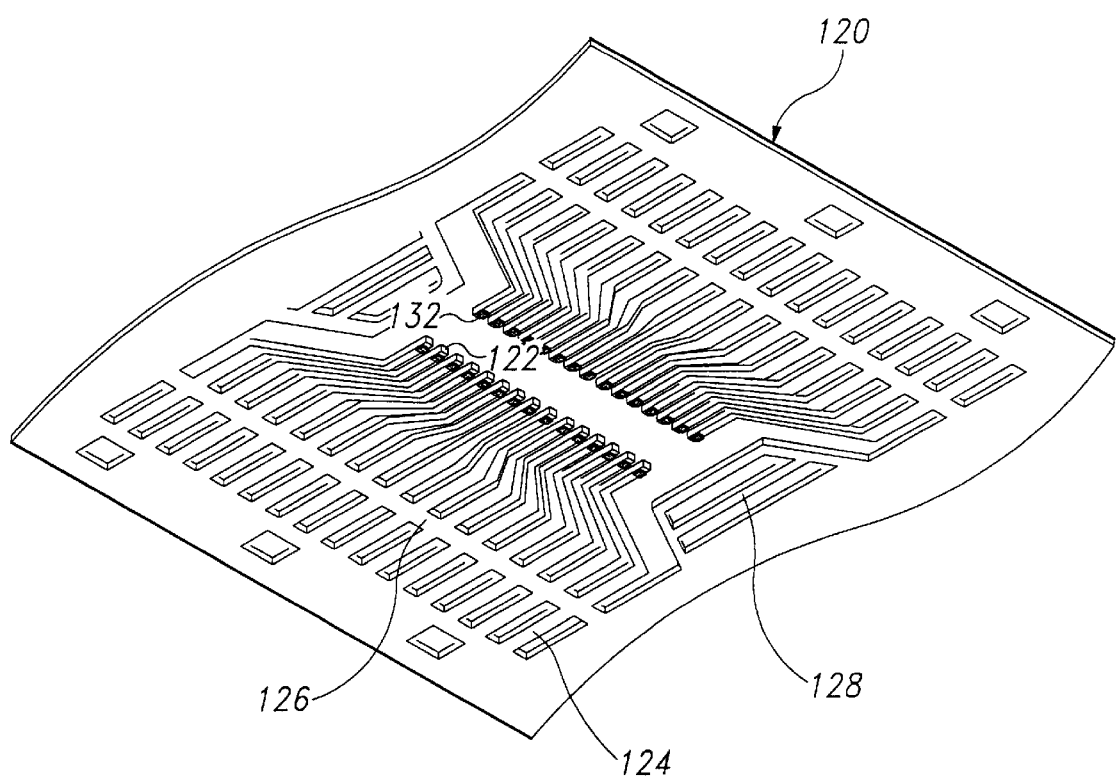
FIG. 4 is a perspective view showing the bottom surface of the lead frame with a liquid adhesive applied thereto according to the present invention.

FIG. 4 is a perspective view showing the bottom surface of the lead frame 120 after a liquid adhesive 132 has been applied. As shown in FIG. 4, the liquid adhesive 132, which has a certain viscosity sufficient to stay adhered to the leads, is applied to the bottom surface of the inner leads 122. The liquid adhesive 132 is transformed into the solid adhesive layer (130 of FIG. 3) by a curing process performed while the chip 110 is in contact with the lead frame 120 to thereby attach the chip to the lead frame. Thermosetting resins which are electrically non-conductive, such as epoxy, are primarily used as the liquid adhesive 132. However, thermoplastic resins such as polyether amid or polyimide siloxane can be used as alternates. The curing temperature of the thermosetting resins is about 150° C. to about 200° C. and that of the thermoplastic resins is about 200° C. to about 400° C.

Figure 5:
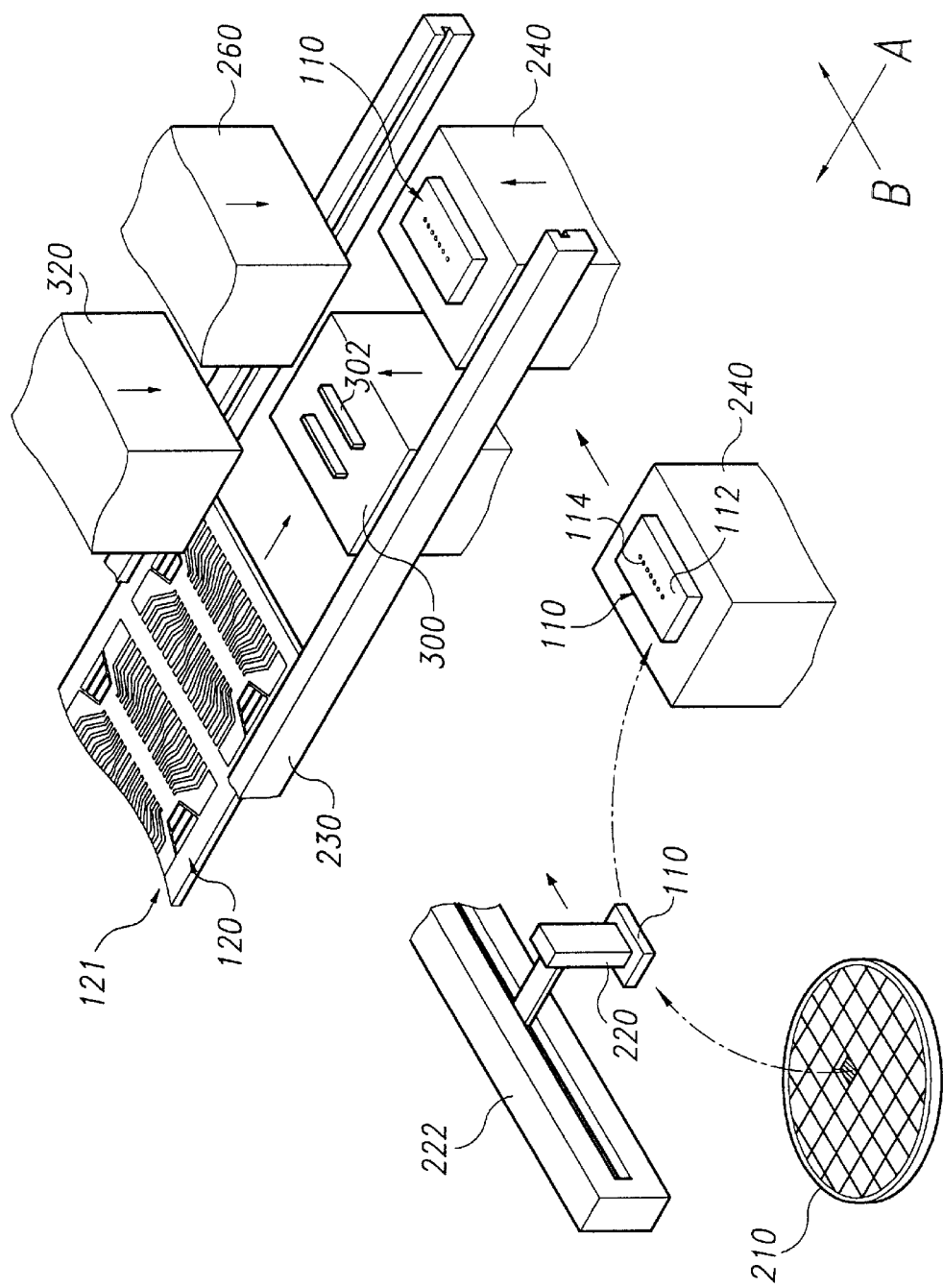
FIG. 5 is a schematic perspective view for explaining a chip attach process in which the liquid adhesive is directly applied to the bottom surface of the lead frame, the chip is moved from the wafer to a position below the lead frame, and then the chip is attached to the lead frame using the liquid adhesive.
Figure 6A:
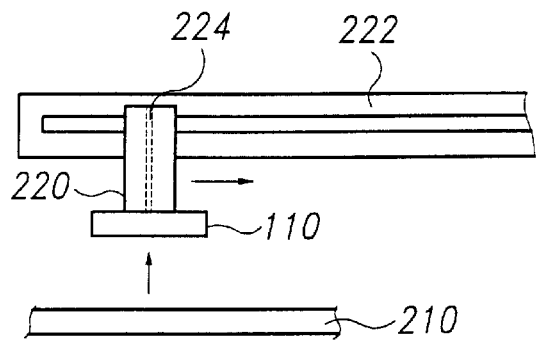
FIG. 6A to FIG. 6C are schematic views for explaining steps of the chip attach process of FIG. 5 as viewed from direction A in FIG. 5.
Figure 6B:
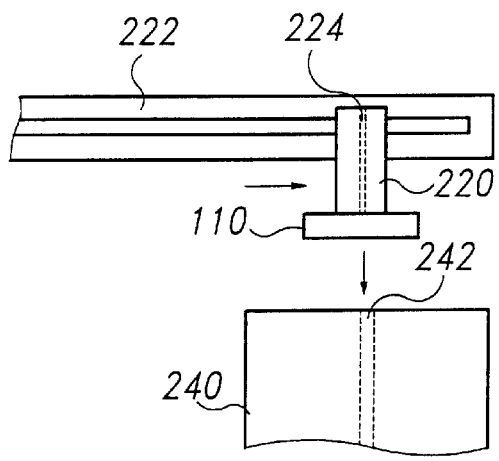
Figure 6C:
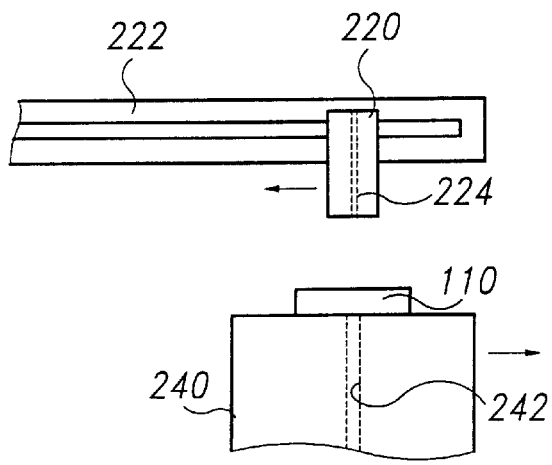

FIG. 5 is a schematic view for explaining a chip attach process in one embodiment of the method in which the liquid adhesive 132 is applied directly to the bottom surface of each lead frame 120 on a strip 121 of lead frames 120. In this process the chip 110 is then attached to each lead frame 120 using the liquid adhesive 132. FIG. 6A to FIG. 6I are schematic views for explaining the steps of the chip attach process of FIG. 5. FIG. 6A to FIG. 6C show the first process steps from the direction of 'A' in FIG. 5 and FIG. 6D to FIG. 6I show the subsequent process steps from the direction of 'B' in FIG. 5.

The steps in which the chip 110 is removed from a wafer 210 and then loaded to a bonding stage 240 are illustrated in FIG. 6A to FIG. 6C. As seen from FIG. 5, and FIG. 6A to FIG. 6C, the chip 110 is removed from the wafer 210 by means of a transfer tool 220. There is a vacuum hole 224 for holding the chip 110 to the transfer tool 220. The transfer tool 220 moves up from the wafer 210, moves along a guide arm 222 from the wafer 210 to a bonding stage 240, and then moves down to the bonding stage 240. Accordingly, the chip 110 is removed from the wafer 210, transferred to the bonding stage 240, and then loaded onto the bonding stage 240. The bonding stage 240 also has a vacuum hole 242 for holding the chip 110 in place. When the chip 110 is loaded onto the bonding stage 240, the suction through the vacuum hole 224 in the transfer tool 220 is interrupted, while the suction through the vacuum hole 242 in the bonding stage 240 begins. The transfer tool 220 moves back to the wafer 210 after the chip 110 is loaded to the bonding stage 240 to remove the next chip. After the chip 110 is loaded, and at the same time as the transfer tool 220 is moving back to the wafer, the bonding stage 240 moves, by any conventional transfer mechanism, to a position below the transfer rails 230.

Figure 6D:
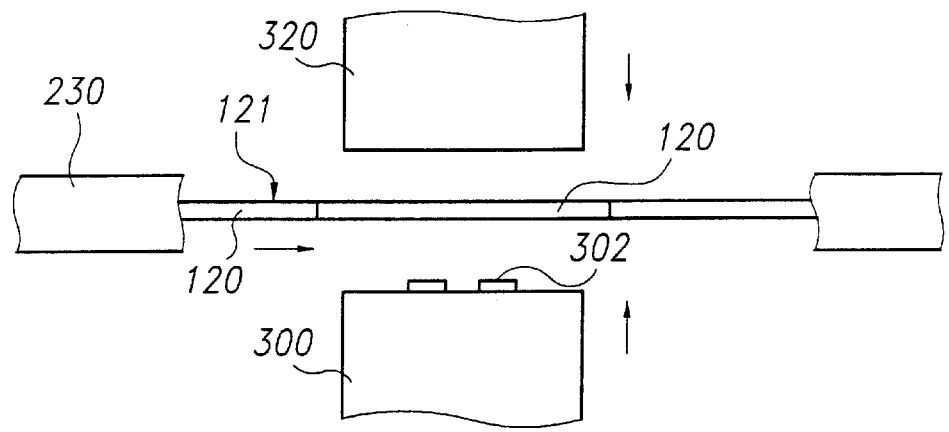
FIG. 6D to FIG. 6I are schematic views for explaining subsequent steps of the chip attach process of FIG. 5 as viewed from direction B in FIG. 5.
Figure 6E:
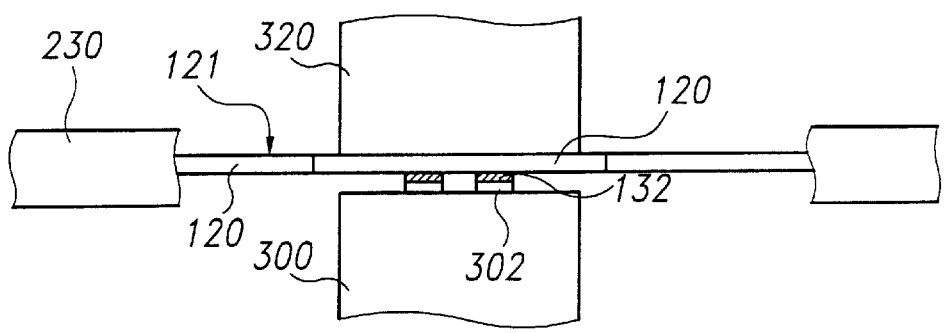
Figure 6F:
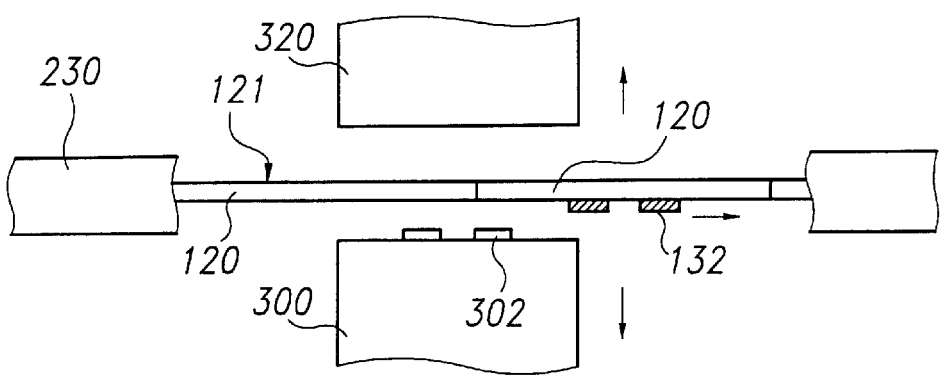

Meanwhile, a strip 121 of lead frames 120 is loaded to the transfer rails 230 from a magazine (not shown) and then transferred along the transfer rails 230. While the lead frame strip 121 is in the transfer rails, the liquid adhesive 132 is applied to each lead frame 120 as shown in FIG. 6D to FIG. 6F. Referring to FIG. 5, and FIG. 6D to FIG. 6F, an adhesive applying tool 300 is located under the transfer rails 230 and can move up and down. Therefore, the adhesive applying tool 300 can apply the liquid adhesive 132 to the bottom surface of the lead frame 120. The adhesive applying tool 300 includes a reservoir (not shown) which contains the liquid adhesive 132 and discharge projections 302 through which the liquid adhesive 132 is discharged from the reservoir. The adhesive applying tool 300 further includes a support head 320 which is located above the transfer rails 230. The support head 320 supports the top surface of each lead frame 120 while the liquid adhesive 132 is applied to the bottom surface of the lead frame 120. The adhesive applying tool 300 is described in more detail below.

In operation, the adhesive applying tool 300 moves up toward the bottom surface of the lead frame 120 and applies the liquid adhesive 132 through the discharge projections 302, while the support head 320 moves down and supports the top surface of the lead frame 120. After the adhesive applying step is conducted, the adhesive applying tool 300 and the support head 320 are moved apart in the opposite directions, and the strip 121 of lead frames 120 is transferred again along the rails 230. The next lead frame 120 is then positioned over the adhesive applying tool 300. Therefore, the adhesive applying tool 300 can apply the liquid adhesive 132 to the next lead frame 120 of the strip 121. As described above, FIG. 4 illustrates one lead frame 120 in the state of this step, that is, where the bottom surface of the lead frame 120 has the liquid adhesive 132 already applied. The present invention thus eliminates the need for a pre-baking step of the lead frame with the applied adhesive as in the conventional method using laminated tape.

Figure 6G:
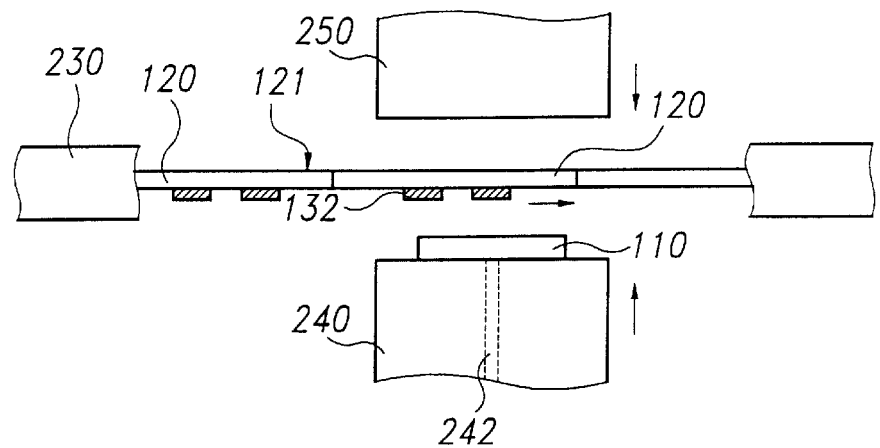
Figure 6H:
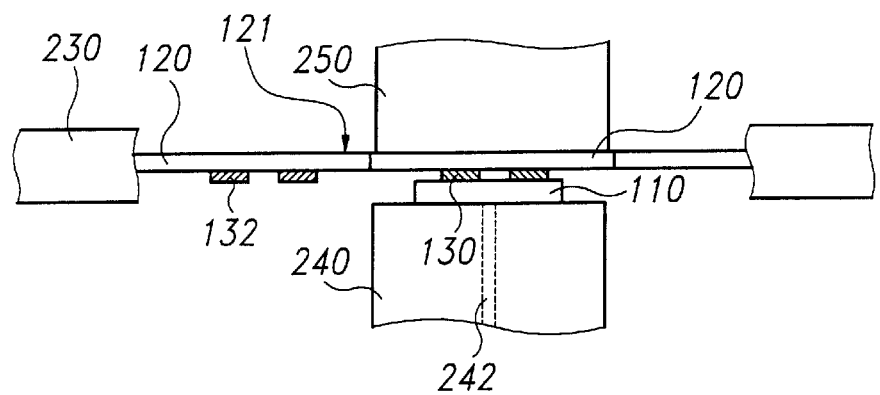
Figure 6I:
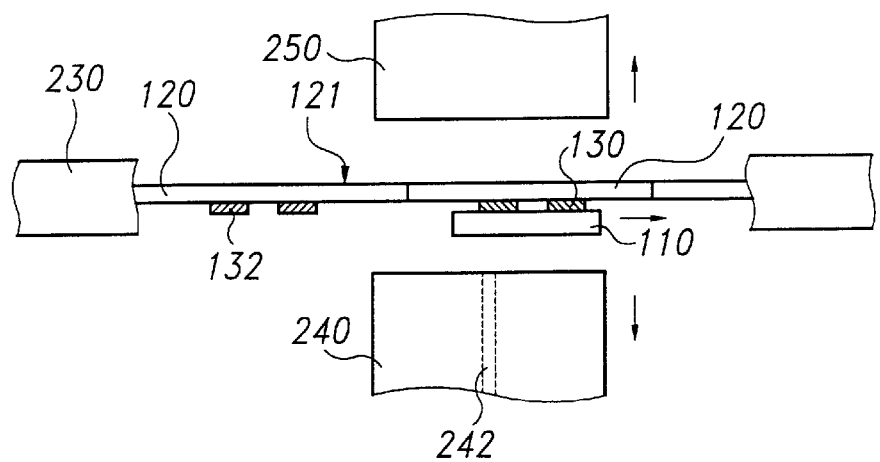

Referring again to FIG. 5, once the chip 110 is loaded onto the bonding stage 240 and the liquid adhesive 132 is applied to the lead frame 120 as described above, the chip 110 is attached to the lead frame 120 as illustrated in FIG. 6G to FIG. 6I. As shown in FIG. 5, and FIG. 6G to FIG. 6I, the bonding stage 240 having the chip 110 thereon is moved to a position below the transfer rails 230. The lead frame 120 is then positioned above the bonding stage 240. A bonding head 250 for pressing down on the top surface of the lead frame 120 is located above the transfer rails 230 and above the bonding stage 240 when the latter is positioned below the rails 230. While the lead frame strip 121 is stopped, the chip 110 on the bonding stage 240 is aligned with a lead frame 120, so that the electrode pads 114 on the chip 1 10 can be exposed through the space between opposing rows of the inner leads (122 in FIG. 3 and FIG. 4) of the lead frame 120. Then the bonding stage 240 moves up and the bonding head 250 moves down simultaneously.

Therefore, the liquid adhesive 132 under the lead frame 120 contacts the active surface 112 of the chip 110. At this time the liquid adhesive 132 is cured and turned into the adhesive layer 130 in a solid state by thermocompressing the lead frame 120 and the chip 110 between the bonding stage 240 and the bonding head 250. After this chip-attaching step, the bonding stage 240 and the bonding head 250 are moved apart again in opposite directions. The chip 110 is now attached to the lead frame 120 of the lead frame strip 121. Then the lead frame 120 is again moved along the rails 230. Next, the bonding stage 240 is moved out from under the rails 230 so as to allow the next chip from the transfer tool 220 to be loaded.

The steps described so far are then repeated. Accordingly, the chips 110 can be attached to the lead frames 120 in close succession.

The chip-attached strip 121 of lead frames 120 is then supplied to the next sequence of process steps. An electrical coupling step connects the electrode pads 114 of the chip 110 to the inner leads 122 of each lead frame 120 by means of bonding wires 140. An encapsulating step encapsulates the chip 110, the inner leads 120, and the bonding wires 140 in the package body 150. A removal step severs the dam bars 126 of the lead frame 120. A transforming step shapes the outer leads 124 of the lead frame 120 into adequate forms for mounting on a circuit board. A detailed description of these steps is omitted herein since these steps are conventional in the assembly process of chip packages.

Figure 7A:
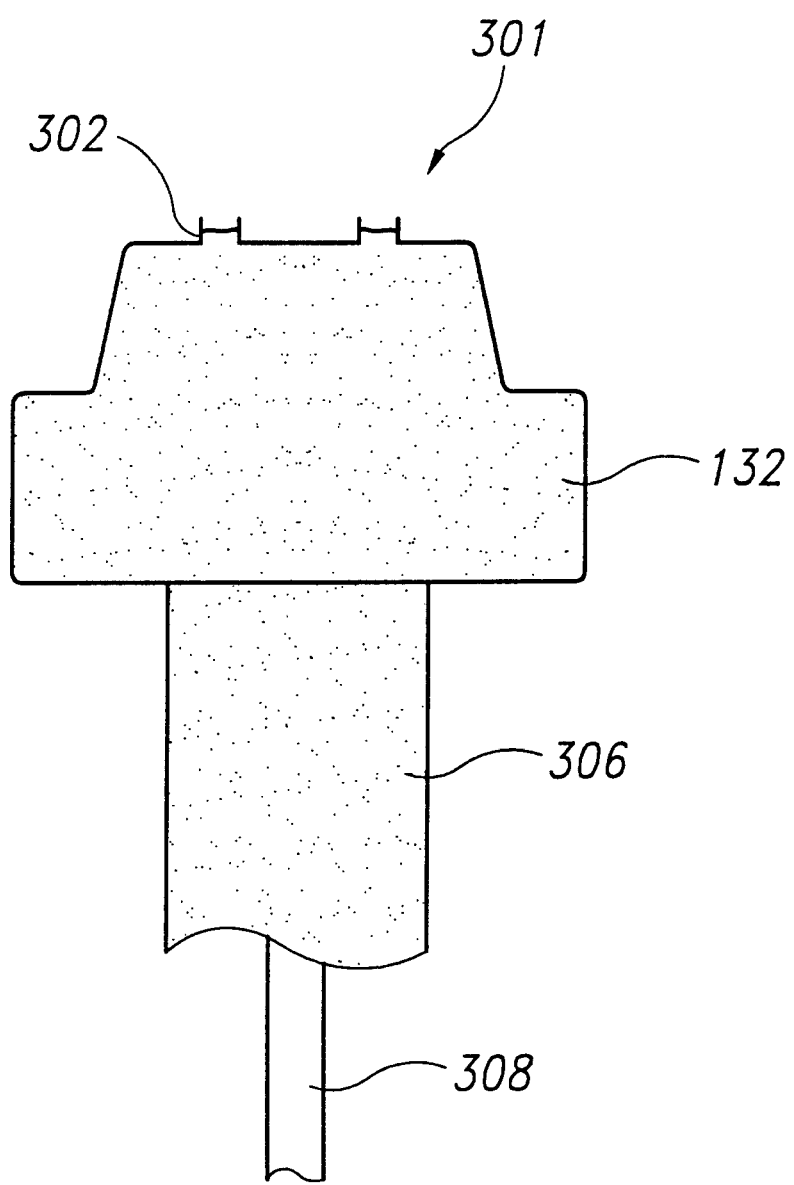
FIG. 7A and FIG. 7B are cross-sectional views of two exemplary embodiments of a tool for applying the liquid adhesive to the lead frame, which utilizes the methods in accordance with the present invention.
Figure 7B:
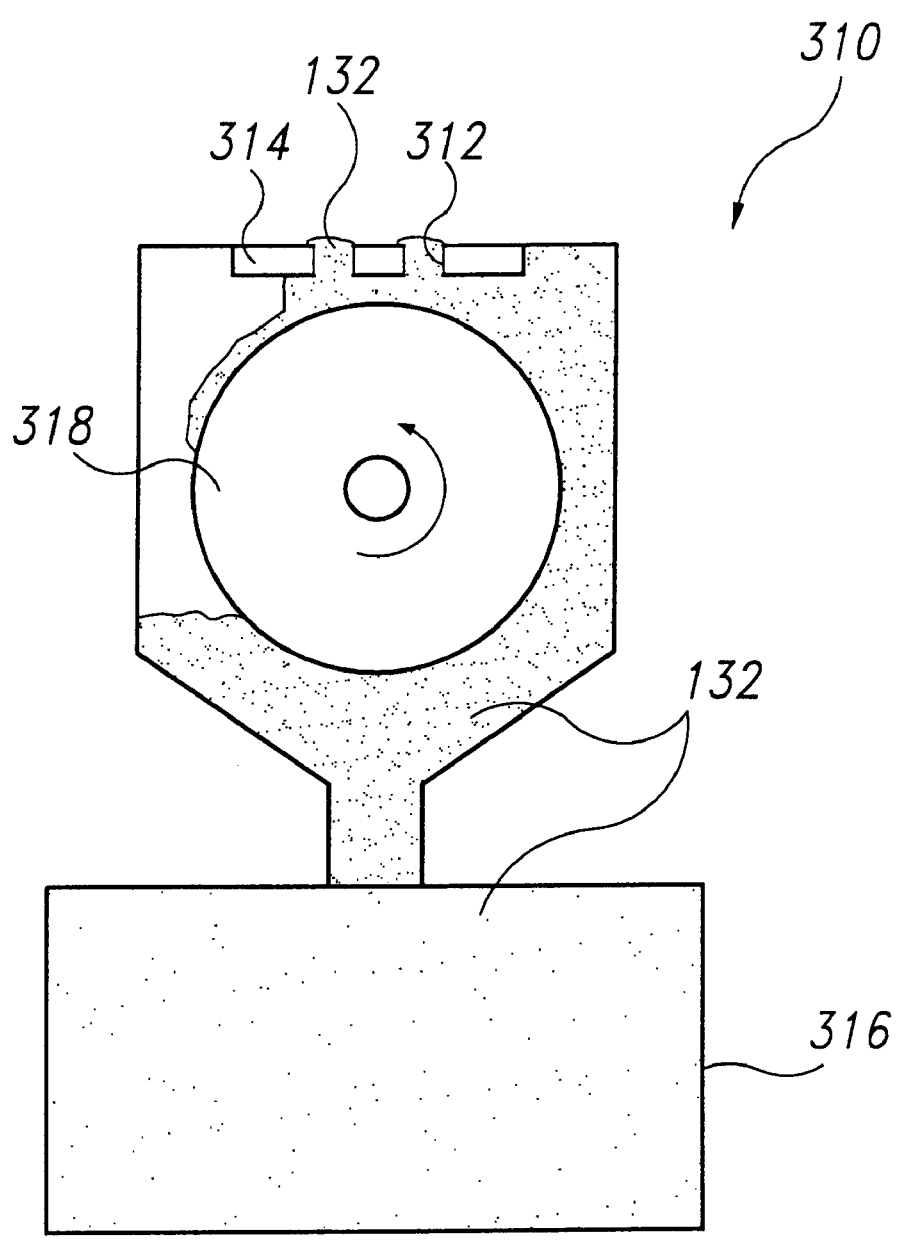

FIG. 7A and FIG. 7B are cross-sectional views of two examples 301 and 310, respectively, of the adhesive applying tool 300 in FIG. 5 and FIG. 6. In FIG. 7A, the tool 301 has a reservoir 306 which contains the liquid adhesive 132, the discharge projections 302 where the liquid adhesive 132 is discharged from the reservoir 306, and an air pressing tube 308 which presses the liquid adhesive 132. When a certain pressure is applied to the liquid adhesive 132 in the reservoir 306 through the pressing tube 308, the liquid adhesive 132 is directly applied to the lead frame 120 through the discharge projections 302.

Another tool 310 which can be alternatively used as the adhesive applying tool is shown in FIG. 7B. The tool 310 also has a reservoir 316, discharge projections 312, and an air pressing tube (not shown). Additionally, the tool 310 may have a roller 318 or mask 314 or both below the discharge projections 312 so as to discharge the liquid adhesive 132 uniformly.

The present invention has many advantageous features. One is that the number of adhesive layer interfaces is reduced and the reliability is improved because the LOC semiconductor package has a single adhesive layer. Another advantage is that the adhesive layer is easily produced through a simple process in which the liquid adhesive is applied directly to the inner leads of the lead frame, then brought in contact with the chip, and then cured. As a result, the present invention provides the lead-on-chip semiconductor package with a simple manufacturing process, a lower production cost, and an improved reliability.

In the drawings and specification, there have been disclosed typical preferred embodiments of the invention and, although specific terms are employed, they are used in a generic and descriptive sense only and not for purposes of limitation. It should be clear to one skilled in the art that many variations and modifications can be implemented without departing from the scope of this invention as set forth in the following claims and their equivalents.

What is claimed is:

1. A method for manufacturing lead-on-chip semiconductor packages, comprising steps of:

preparing a lead frame having a plurality of inner leads and a plurality of outer leads;

placing a liquid adhesive having a certain viscosity in direct contact with bottom surfaces of the plurality of inner leads, to thereby apply the liquid adhesive to the plurality of inner leads;

positioning a semiconductor chip under the lead frame, the semiconductor chip having an active surface on which a plurality of electrode pads are formed, wherein the plurality of electrode pads are exposed through a space defined between opposing rows of the plurality of inner leads; and pressing the active surface of the semiconductor chip and the liquid adhesive directly against one another, whereby a single layer of adhesive attaches the plurality of leads to the semiconductor chip.

2. The method of claim 1, further comprising steps of:

electrically coupling each of the plurality of electrode pads to respective ones of the plurality of inner leads using a bonding wire; and encapsulating the semiconductor chip, the plurality of inner leads, and the bonding wires with an encapsulant, whereby a package body is formed.

3. The method of claim 1, wherein said placing a liquid adhesive in direct contact with bottom surfaces of the plurality of inner leads comprises discharging the liquid adhesive from a reservoir, containing the liquid adhesive, via a discharge projection.

4. The method of claim 1, wherein said pressing comprises curing the liquid adhesive to form an adhesive layer extending from the active surface of the semiconductor chip to the bottom surfaces of the inner leads.

5. The method of claim 1, wherein said placing a liquid adhesive comprises placing a thermosetting resin in direct contact with bottom surfaces of the plurality of inner leads.

6. The method of claim 1, wherein said placing a liquid adhesive comprises placing a thermoplastic resin in direct contact with bottom surfaces of the plurality of inner leads.

7. A method for manufacturing lead-on-chip semiconductor packages, comprising steps of:

loading a semiconductor chip to a bonding stage and loading a lead frame to transfer rails, the semiconductor chip having an active surface on which a plurality of electrode pads are formed, and the lead frame having a plurality of inner leads and a plurality of outer leads;

dispensing a liquid adhesive having a certain viscosity directly onto bottom surfaces of the plurality of inner leads using an adhesive applying tool disposed at least partly below the transfer rails, to thereby apply the liquid adhesive to the plurality of inner leads;

moving the bonding stage to position the semiconductor chip below the lead frame after the adhesive is dispensed onto the bottom surfaces of the plurality of inner leads, wherein the plurality of electrode pads of the semiconductor chip are exposed through a space defined between opposing rows of the plurality of inner leads; and pressing the active surface and the liquid adhesive directly against one another, whereby a single layer of adhesive attaches the plurality of leads to the semiconductor chip.

8. The method of claim 7, wherein said pressing comprises:

moving a bonding head from above the transfer rails downwardly toward the lead frame, and simultaneously moving the bonding stage upwardly toward the lead frame; and thermocompressing the semiconductor chip and the lead frame between the bonding head and the bonding stage, wherein as adhesive layer is formed by curing the liquid adhesive.

9. The method of claim 7, further comprising:

electrically coupling each of the plurality of electrode pads to respective ones of the plurality of inner leads using a bonding wire; and encapsulating the semiconductor chip, the plurality of inner leads, and the bonding wires, with an encapsulant, whereby a package body is formed.

10. The method of claim 7, wherein said dispensing a liquid adhesive comprises discharging the liquid adhesive from a reservoir containing the liquid adhesive, via a discharge projection.

11. The method of claim 10, wherein said dispensing comprises supporting a top surface of the lead frame while the liquid adhesive is applied to the bottom surface of the lead frame, using a support head of the adhesive applying tool, the support head disposed above the transfer rails.

12. The method of claim 10, wherein said dispensing comprises rotating a roller below the discharge projection so as to uniformly discharging the liquid adhesive.

13. The method of claim 7, wherein said dispensing a liquid adhesive comprises placing a thermosetting resin in direct contact with bottom surfaces of the plurality of inner leads.

14. The method of claim 7, wherein said dispensing a liquid adhesive comprises placing a thermoplastic resin in direct contact with bottom surfaces of the plurality of inner leads.

15. The method of claim 1, wherein said placing resulting in the liquid adhesive forming a discontinuous pattern orthogonal to the inner leads.

16. The method of claim 15, wherein said placing results in the liquid adhesive being substantially only the inner leads.

17. The method of claim 7, wherein said placing resulting in the liquid adhesive forming a discontinuous pattern orthogonal to the inner leads.

18. The method of claim 17, wherein said placing results in the liquid adhesive being substantially only the inner leads.

* * * * *